(12) United States Patent
Lee et al.

(10) Patent No.: US 6,770,954 B2
(45) Date of Patent: *Aug. 3, 2004

(54) SEMICONDUCTOR DEVICE WITH SI-GE LAYER-CONTAINING LOW RESISTANCE, TUNABLE CONTACT

(75) Inventors: Brian S. Lee, Hsinchu (TW); John Walsh, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/305,147

(22) Filed: Nov. 27, 2002

(65) Prior Publication Data

US 2003/0127738 A1 Jul. 10, 2003

Related U.S. Application Data

(62) Division of application No. 10/035,221, filed on Jan. 4, 2002, now Pat. No. 6,511,905.

(51) Int. Cl.[7] .............................................. H01L 31/117

(52) U.S. Cl. ........................ 257/616; 257/384; 257/751; 257/753

(58) Field of Search ................................. 257/616, 382, 257/383, 384, 751, 753, 754, 369

(56) References Cited

U.S. PATENT DOCUMENTS

| | | | | |
|---|---|---|---|---|
| 5,563,448 A | * | 10/1996 | Lee et al. | 257/742 |
| 6,075,291 A | * | 6/2000 | Thakur | 257/751 |
| 6,184,098 B1 | * | 2/2001 | Noguchi | 438/301 |
| 6,376,368 B1 | * | 4/2002 | Jung et al. | 438/639 |
| 6,511,905 B1 | * | 1/2003 | Lee et al. | 438/629 |
| 6,521,956 B1 | * | 2/2003 | Lee | 357/384 |

* cited by examiner

*Primary Examiner*—Mark V. Prenty
(74) *Attorney, Agent, or Firm*—Birch, Stewart, Kolasch & Birch, LLP (57) ABSTRACT

The present invention provides a semiconductor device in which a low resistance, tunable contact is formed by means of using a $Si_xGe_{1-x}$ (0<x<1) layer. Thus, only moderate doping is required, which in turn protects the device from short channel effect and leakage. The low resistance, tunable contact is suitable for CMOS devices.

14 Claims, 15 Drawing Sheets

SEMICONDUCTOR DEVICE WITH SI-GE LAYER-CONTAINING LOW RESISTANCE, TUNABLE CONTACT

This application is a divisional of application Ser. No. 10/035,221, filed on Jan. 4, 2002 and now U.S. Pat. No. 6,511,905, the entire contents of which are hereby incorporated by reference and for which priority is claimed under 35 U.S.C. § 120.

BACKGROUND OF THE INVENTION

1. Field of the Invention

The present invention relates to a semiconductor device with a metal/semiconductor interface, and more particularly to a semiconductor device in which a low resistance, tunable contact is formed by means of using a $Si_xGe_{1-x}$ (0<x<1) layer.

2. Description of the Prior Art

It has been customary in modern semiconductor manufacturing technique to form MS (metal-semiconductor) contact by forming is either an Ohmic contact or a diffusion contact. The former technique is performed by implanting dopants into the MS interface layer to a concentration above solid solubility limit (i.e. $N(n,p) > 10^{20}$ $cm^{-3}$) to form a tunneling barrier. On the other hand, the latter technique is performed by diffusing dopants into the interface layer to lower the Schottky Barrier Height (SBH).

Silicon, a frequently used semiconductor, has a high intrinsic SBH (or Eg (energy gap)), Eg=1.11 eV. Therefore, when silicon is used, a relatively high doping concentration is required at the MS interface layer, which is usually performed using high-energy implantation, to lower the SBH in order to form a better contact. However, the high-energy implantation results in unwanted deep contact junctions, which subjects the device to short channel effect (SCE) or punch-through (leakage).

SUMMARY OF THE INVENTION

An object of the present invention is to solve the above-mentioned problems and provide a semiconductor device having a metal/semiconductor interface with low resistance contact.

Another object of the present invention is to provide a process to form a low resistance contact at a metal/semiconductor interface using moderate doping requirements, which in turn protect the device from short channel effect and leakage.

A further object of the present invention is to provide a low resistance, tunable contact suitable for CMOS devices.

To achieve the above objects, the semiconductor device of the present invention includes a semiconductor substrate; a dielectric layer on the semiconductor substrate, having a contact opening exposing the semiconductor substrate; a $Si_xGe_{1-x}$-layer formed within the contact opening, wherein 0<x<1; and a metal plug over the $Si_xGe_{1-x}$ layer filling the contact opening.

The present invention also provides a process to form a metal contact at a metal/semiconductor interface. First, a dielectric layer is formed on a semiconductor substrate. A contact opening is formed in the dielectric layer to expose the semiconductor substrate. A $Si_xGe_{1-x}$ layer is formed in the contact opening, wherein 0<x<1. Finally, a metal plug is filled over the $Si_xGe_{1-x}$ layer into the contact opening.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

The band gap energy of $Si_xGe_{1-x}$ varies from 0.67 eV (x=0) to 1.11 eV (x=1). That is to say, $Si_xGe_{1-x}$ (0<x<1) has a lower band gap energy than pure silicon.

The main feature of the present invention resides in that a $Si_xGe_{1-x}$ layer (0<x<1), a lower band gap energy semiconductor material, is formed within a contact opening at a metal/semiconductor interface. Lower band gap energy will reduce the SBH of metal-semiconductor (MS) interface by lowering the Fermi level of the MS. The lowered SBH will lower the contact resistance, thus, a good contact at the metal/semiconductor interface can be formed using moderate doping requirements. This in turn protects the device from short channel effect and leakage.

First, FIGS. 1a to 1e illustrate the process flow of fabricating a metal contact at a metal/semiconductor interface according to a first embodiment of the present invention.

Figure 1A:
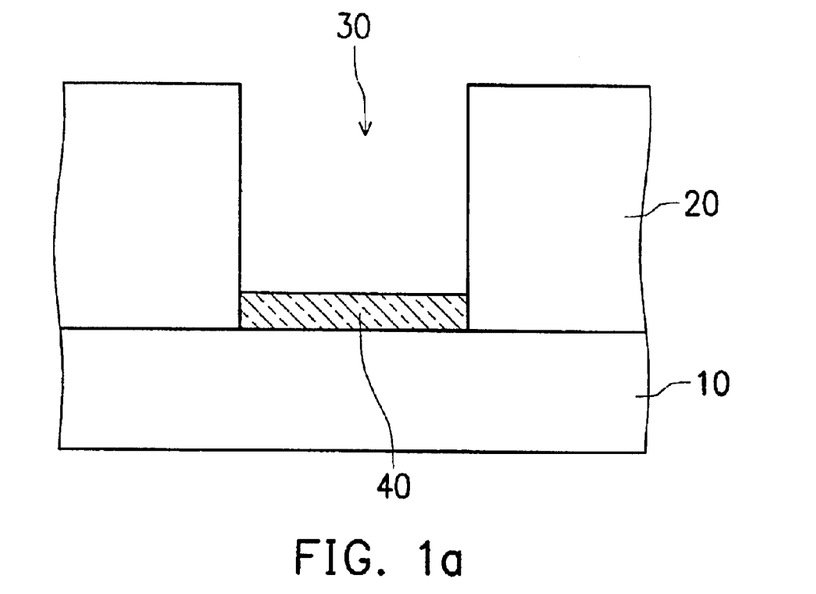
FIGS. 1a to 1e are cross-sections illustrate the process flow of fabricating a metal contact at a metal/semiconductor interface according to a first embodiment of the present invention.

In FIG. 1a, a dielectric layer 20 is formed on a semiconductor substrate 10. A contact opening 30 is formed in the dielectric layer 20 to expose the semiconductor substrate 10. Next, a $Si_xGe_{1-x}$ layer 40 (0<x<1) is formed in the contact opening 30.

The $Si_xGe_{1-x}$ 40 can be formed by a variety of methods, such as MBE (molecular beam epitaxy), UHV-CVD (ultra-high vacuum chemical vapor deposition), RT-CVD (rapid thermal CVD), and LRP-CVD (limited reaction processing CVD). For example, the $Si_xGe_{1-x}$ layer 40 can be formed by selective epitaxial growth at a relatively low temperature range (<800° C.).

The $Si_xGe_{1-x}$ layer 40 is preferably a silicon-rich $Si_xGe_{1-x}$ layer, which has properties closer to those of pure silicon. This causes a less chance of dislocation. For example, x is preferably in the range of 0.5<x<0.95.

It has been reported that a thin layer of SiGe thinner than a critical thickness, which varies depending upon its stochiometry and deposition conditions, does not cause a dislocation in silicon substrate even with high temperature post processes. Therefore, it shall be noted that the $Si_xGe_{1-x}$ layer 40 thickness should be controlled to be less than the critical thickness to maintain it as a strained state not to cause dislocation in silicon substrate due to its lattice mismatch between silicon and SiGe, otherwise the junction will be leaky.

The $Si_xGe_{1-x}$ layer 40 is preferably a strained $Si_xGe_{1-x}$ layer not causing dislocation in the semiconductor substrate 10. The $Si_xGe_{1-x}$ layer 40 is preferably more than or equal to 5 nm and less than or equal to 30 nm. Thus, a low resistance Ohmic contact can be achieved.

Figure 1B:
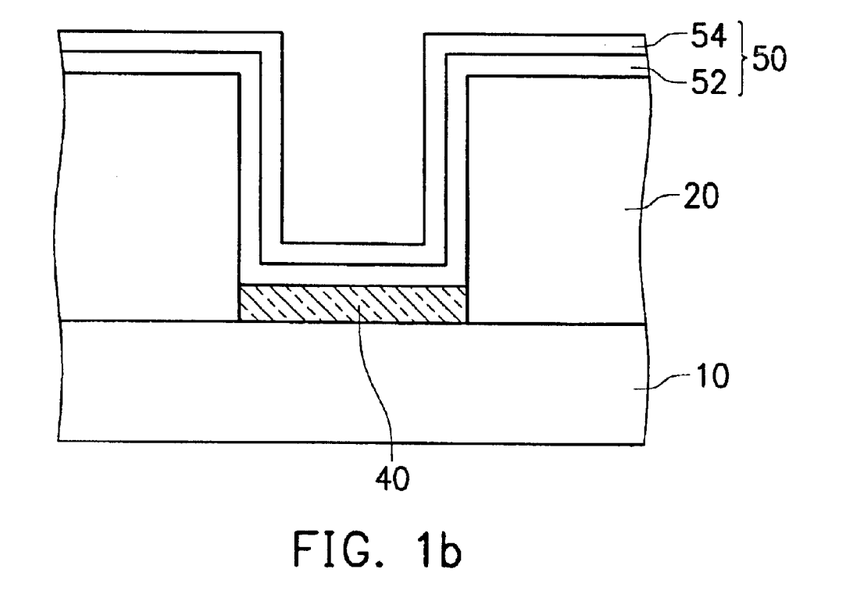

Subsequently, in FIG. 1b, a metal layer 50 is formed on the $Si_xGe_{1-x}$ layer 40. For example, the metal layer can be composed of a glue layer 52 and a diffusion barrier layer 54, which are formed both on the $Si_xGe_{1-x}$ layer 40 and on the sides of the contact opening 30. The glue layer 52 can be a titanium (Ti) layer, which has good adhesion to dielectric layer 20. The diffusion barrier layer 54 can be a TiN layer, serving as a diffusion barrier to protect the semiconductor silicon substrate 10 from fluorine attack during post tungsten deposition processes. Alternatively, the glue/diffusion barrier layer can also be a W/WN layer.

Figure 1C:
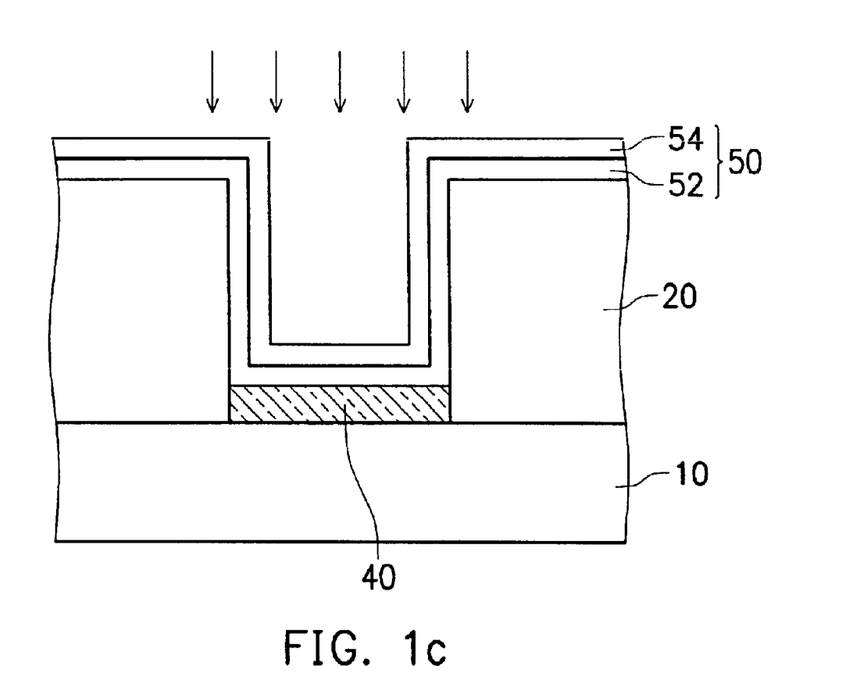

Subsequently, in FIG. 1c, a dopant is implanted into the metal layer 50 and the $Si_xGe_{1-x}$ layer 40. The implanting can be conducted at a low energy (100 eV to 10 KeV) and low dose(1E14 atoms/cm$^2$ to 1E15 atoms/cm$^2$), or preferably conducted at a high energy (20 KeV to 80 KeV) and low dose (5E14 atoms/cm$^2$ to 3E15 atoms/cm$^2$). Alternatively, the implanting can be conducted by an ion mixing method. That is, first, a low energy (100 eV to 10 KeV) and high dose ($1\times10^{15}$ to $1\times10^{16}$ atoms/cm$^2$) implantation is conducted, then, a high energy (20 KeV to 80 KeV) and low dose (5E13 to 5E14 atoms/cm$^2$) is conducted. The low energy, high dose implanation can be performed by PLAD (plasma doping) or alternatively PIII (plasma ion immersion implantation). The high energy, low dose implantation can be performed by conventional beam-line I/I (ion implantation).

Figure 1D:
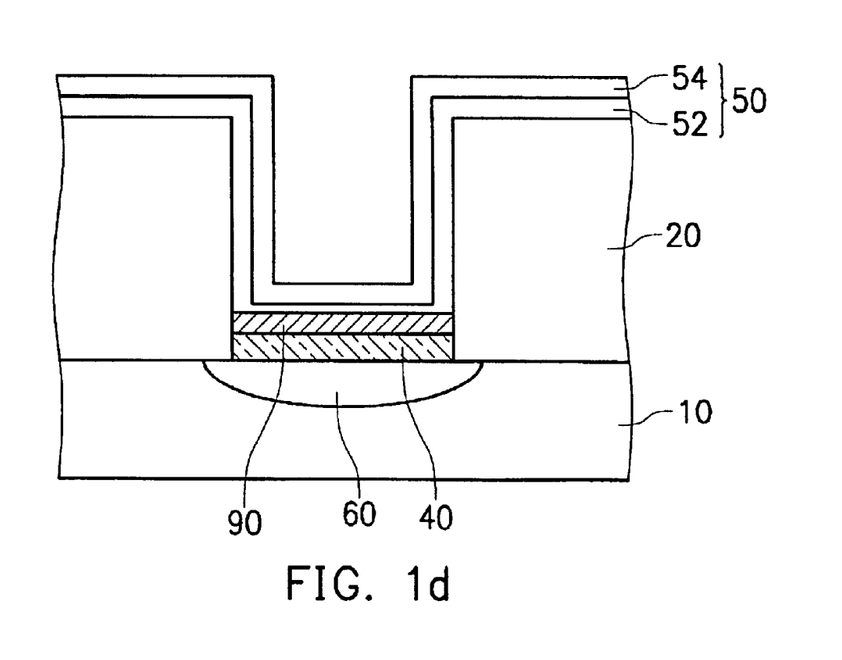

Subsequently, in FIG. 1d, annealing is conducted to transform the metal layer 50 into a metal silicide layer 90 and to diffuse the dopant into the semiconductor substrate 10 in a SADS (salicide as a doping source) manner to form a diffusion region 60. It can be seen in the figure that a portion of the $Si_xGe_{1-x}$ layer 40 is consumed to form the metal silicide layer 90. Thus, the $Si_xGe_{1-x}$ layer 40 becomes thinner, which adversely affects the SBH of the $Si_xGe_{1-x}$ layer 40. Therefore, a thicker $Si_xGe_{1-x}$ layer 40, for example, more than 30 nm, can be formed to compensate the consumed portion during the silicidation process. Thus, an adequately thick $Si_xGe_{1-x}$ layer 40 can still be retained to maintain low SBH.

Figure 1E:
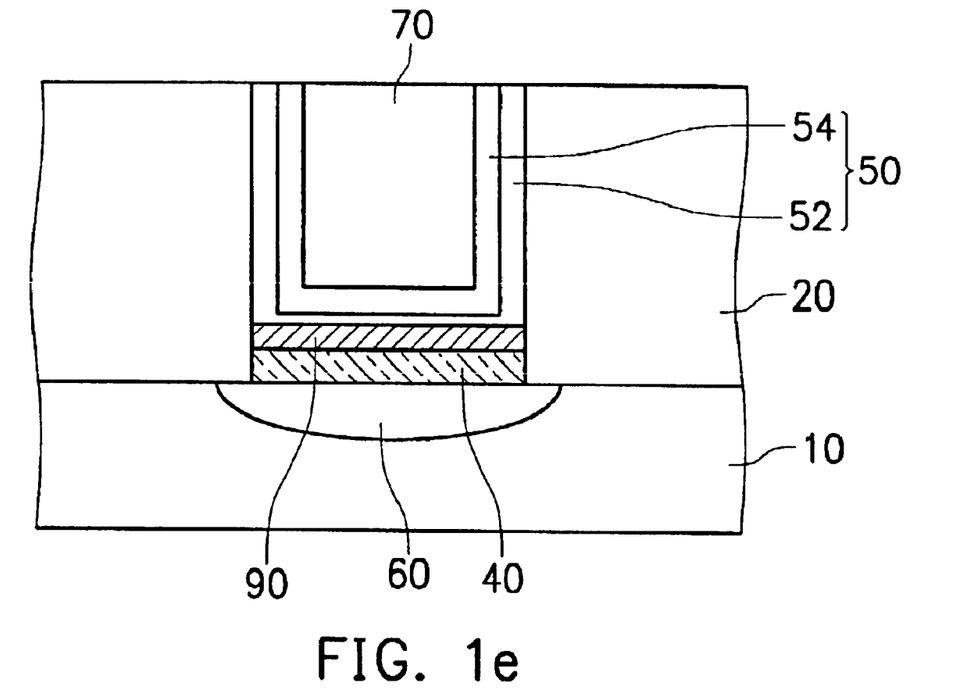

Finally, in FIG. 1e, a metal plug 70 is filled on the metal layer 50 into the contact opening 30. For example, a tungsten layer is formed by selective tungsten deposition. Then, chemical mechanical polishing (CMP) is performed to planarize the tungsten layer and remove the metal layer 50 on the dielectric layer 20.

Now FIGS. 2a to 2d illustrate the process flow of fabricating a metal contact at a metal/semiconductor interface according to a second embodiment of the present invention. Unlike the first embodiment, this embodiment selectively forms a consumable polysilicon layer on the Si—Ge layer. The numerals are the same as in FIGS. 1a to 1e in order to represent the same elements.

Figure 2A:
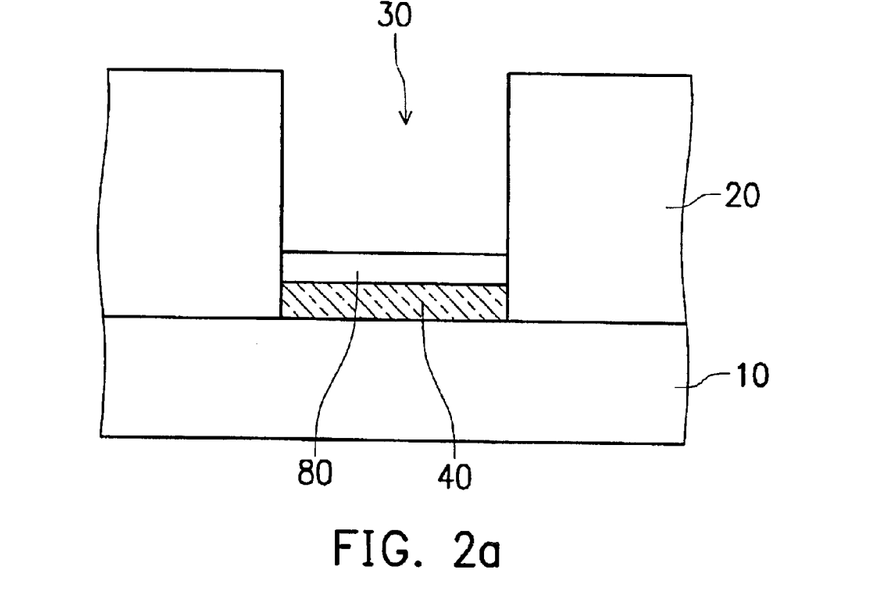
FIGS. 2a to 2d are cross-sections illustrate the process flow of fabricating a metal contact at a metal/semiconductor interface according to a second embodiment of the present invention, wherein a consumable polysilicon layer is selectively formed on the Si—Ge layer.

In FIG. 2a, a dielectric layer 20 is formed on a semiconductor substrate 10. A contact opening 30 is formed in the dielectric layer 20 to expose the semiconductor substrate 10. Next, a $Si_xGe_{1-x}$ layer 40 (0<x<1) is formed in the contact opening 30. Next, a consumable polysilicon layer 80 is formed only on the $Si_xGe_{1-x}$ layer 40.

Figure 2B:
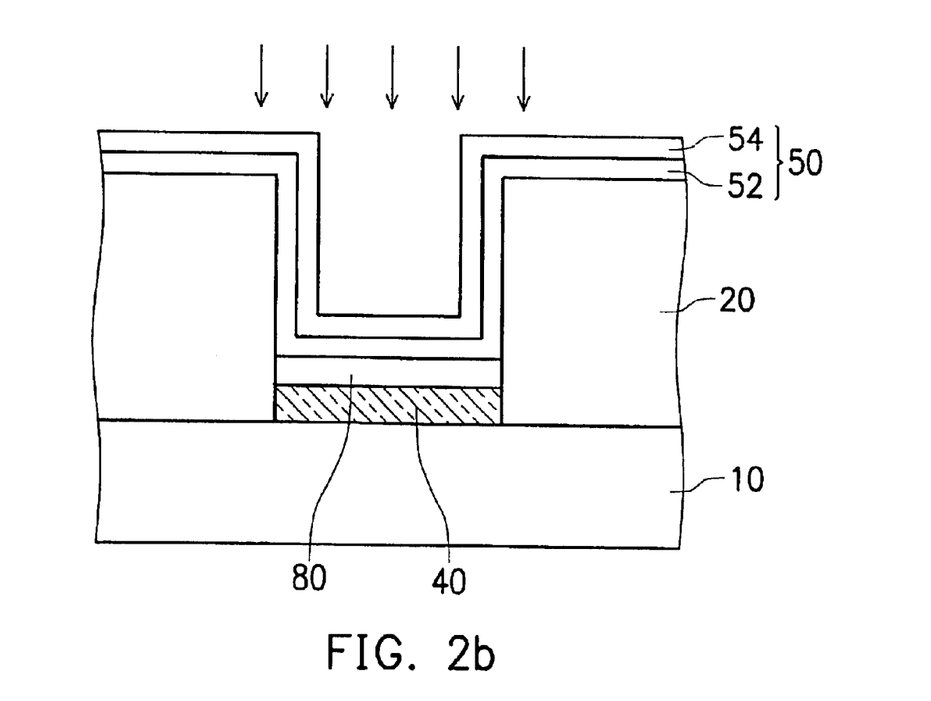

Subsequently, in FIG. 2b, a metal layer 50 is formed on the consumable polysilicon layer 80. For example, the metal layer can be composed of a glue layer 52 and a diffusion barrier layer 54, which are formed both on polysilicon layer 80 and on the sides of the contact opening 30. The glue layer 52 can be a titanium (Ti) layer and the diffusion barrier layer 54 can be a TiN layer. Next, a dopant is implanted into the metal layer 50, the polysilicon layer 80, and the $Si_xGe_{1-x}$ layer 40. The implanting condition can be the same as described in the first embodiment.

Figure 2C:
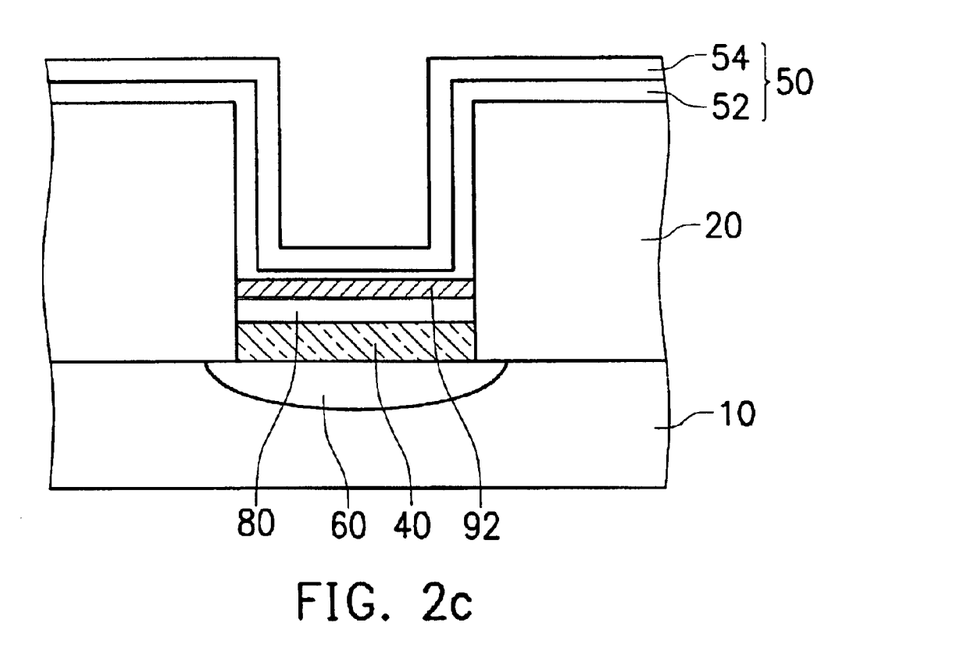

Subsequently, in FIG. 2c, annealing is conducted to transform the metal layer 50 into a metal silicide layer 92 and to diffuse the dopant into the semiconductor substrate 10 in a SADS (salicide as a doping source) manner to form a diffusion region 60. It can be seen in the figure that a portion of consumable polysilicon layer 80 is consumed to form the metal silicide layer 92. Thus, in the silicidation step, the polysilicon layer 80 instead of the $Si_xGe_{1-x}$ layer is consumed. This can maintain the integrity of the $Si_xGe_{1-x}$ layer 40 without becoming thinner, thereby the low SBH can be maintained. In order to allow the polysilicon layer 80 consumed in the silicidation step, while not consuming the $Si_xGe_{1-x}$ layer 40, the polysilicon layer 80 should be adequately thick, preferably with a thickness of 10 nm to 50 nm.

Figure 2D:
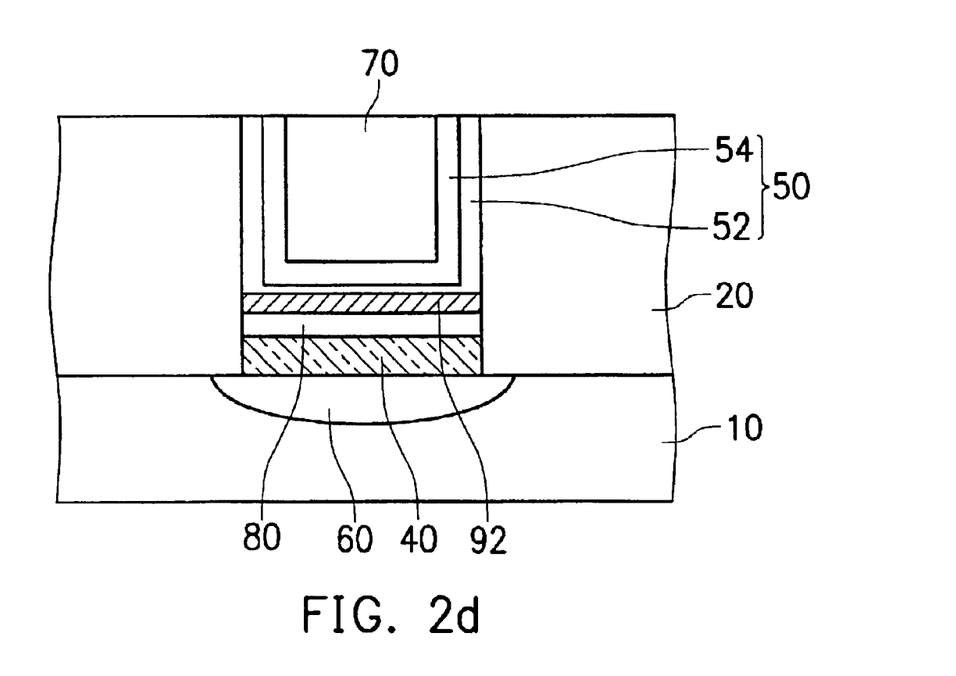

Finally, in FIG. 2d, a metal plug 70 is filled on the metal layer 50 into the contact opening 30. For example, a tungsten layer is formed by selective tungsten deposition. Then, chemical mechanical polishing (CMP) is performed to planarize the tungsten layer and remove the metal layer 50 on the dielectric layer 20.

FIGS. 3a to 3e illustrate the process flow of fabricating a metal contact at a metal/semiconductor interface according to a third embodiment of the present invention. Unlike the first embodiment, this embodiment forms a conformal consumable polysilicon on the $Si_xGe_{1-x}$ layer. The numerals are the same as in FIGS. 1a to 1e in order to represent the same elements.

Figure 3A:
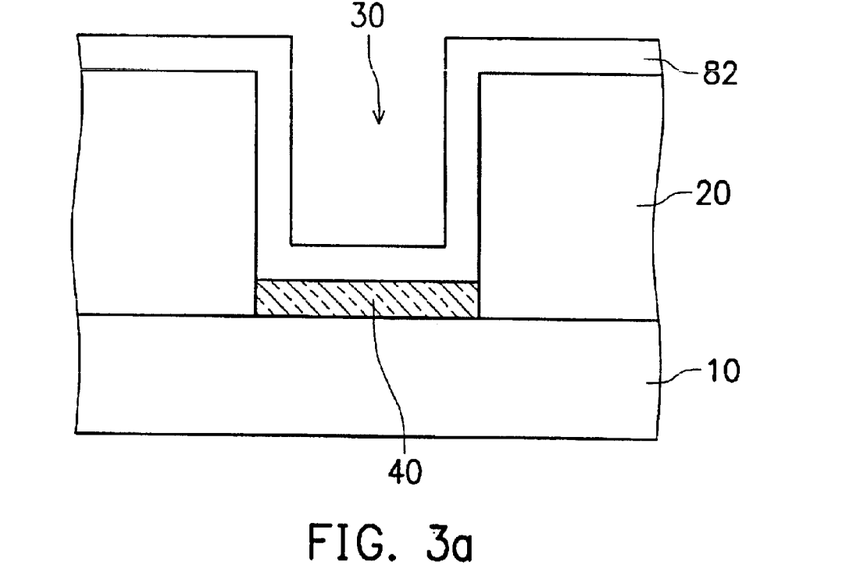
FIGS. 3a to 3e are cross-sections illustrate the process flow of fabricating a metal contact at a metal/semiconductor interface according to a third embodiment of the present invention, wherein a conformal consumable polysilicon is formed.

In FIG. 3a, a dielectric layer 20 is formed on a semiconductor substrate 10. A contact opening 30 is formed in the dielectric layer 20 to expose the semiconductor substrate 10. Next, a $Si_xGe_{1-x}$ layer 40 (0<x<1) is formed in the contact opening 30. Next, a consumable polysilicon layer 82 is conformally formed both on the $Si_xGe_{1-x}$ layer 40 and on the sides of the contact opening 30.

Figure 3B:
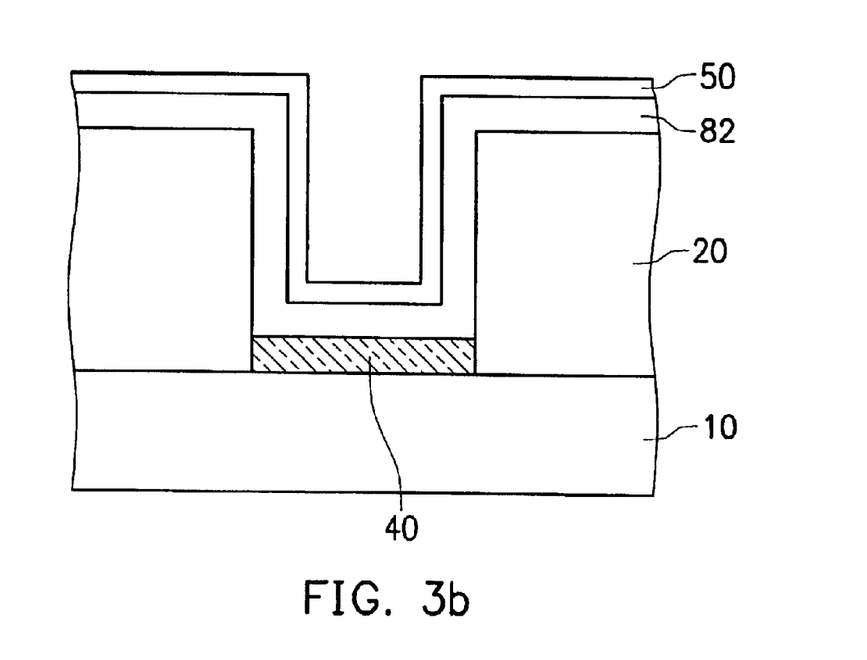

Subsequently, in FIG. 3b, a metal layer 50 is formed on the consumable polysilicon layer 82. For example, the metal layer can be a diffusion barrier layer such as TiN layer.

Figure 3C:
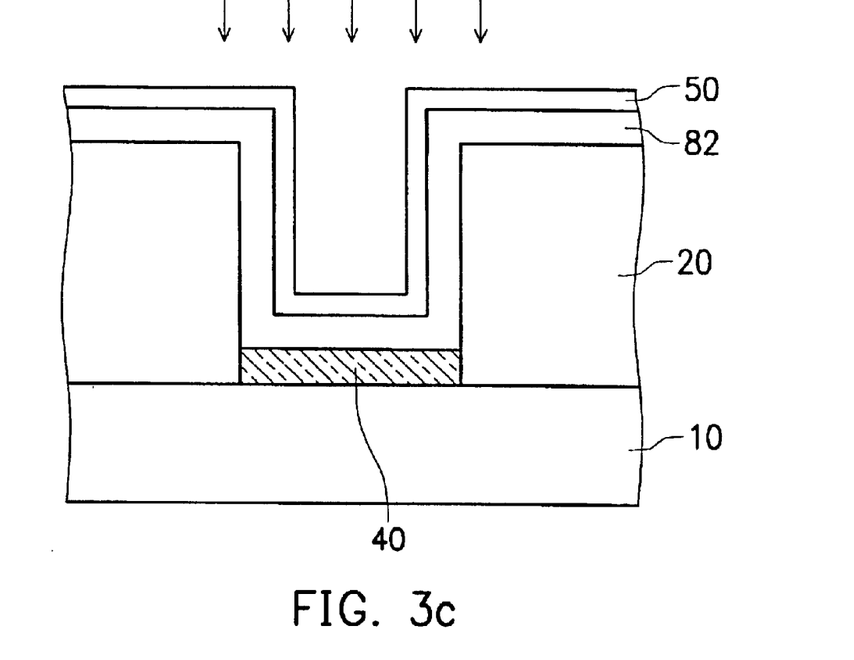

Subsequently, in FIG. 3c, a dopant is implanted into the metal layer 50, the polysilicon layer 82, and the $Si_xGe_{1-x}$ layer 40. The implanting condition can be the same as described in the first embodiment.

Figure 3D:
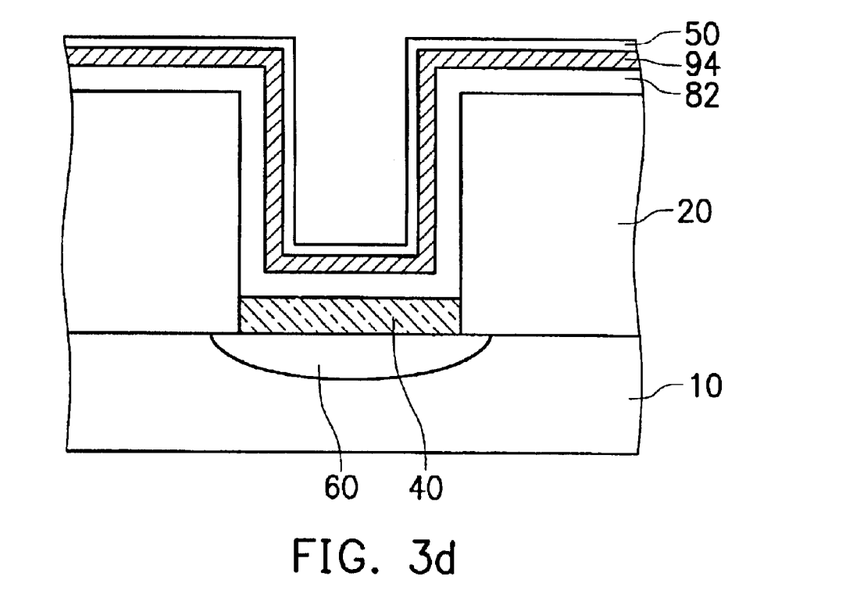

Subsequently, in FIG. 3d, annealing is conducted to transform the metal layer 50 into a metal silicide layer 94 and to diffuse the dopant into the semiconductor substrate 10 in a SADS (salicide as a doping source) manner to form a diffusion region 60. It can be seen in the figure that a portion of the consumable polysilicon layer 82 is consumed to form the metal silicide layer 94. Thus, in the silicidation step, the polysilicon layer 82 instead of the $Si_xGe_{1-x}$ layer 40 is consumed. This can maintain the integrity of the $Si_xGe_{1-x}$ layer 40 without it becoming thinner, thereby the low SBH can be maintained. In order to allow the polysilicon layer 82 to be consumed in the silicidation step, while not consuming the $Si_xGe_{1-x}$ layer 40, the polysilicon layer 82 should be adequately thick, preferably with a thickness of 10 nm to 50 nm.

Figure 3E:
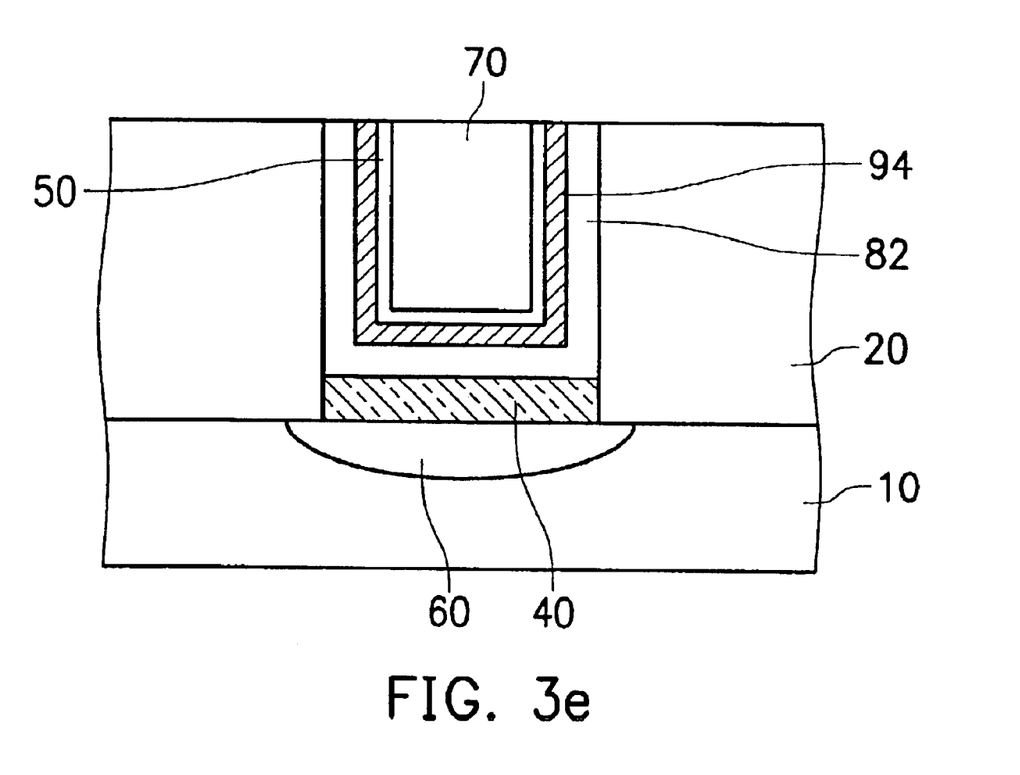

Finally, in FIG. 3e, a metal plug 70 is filled on the metal layer 50 into the contact opening 30. For example, a tungsten layer is formed by selective tungsten deposition. Then, chemical mechanical polishing (CMP) is performed to planarize the tungsten layer and remove the metal layer 50 on the dielectric layer 20.

In this embodiment, the consumable polysilicon layer 82 is conformally formed, that is, it is formed both on the $Si_xGe_{1-x}$ layer 40 and on the sides of the contact opening 30. Since a polysilicon layer serves as an excellent glue layer to the dielectric layer 20, titanium or other glue layers to ILD (inter layer dielectric) may be omitted. This can cut down the production cost.

Figure 4A:
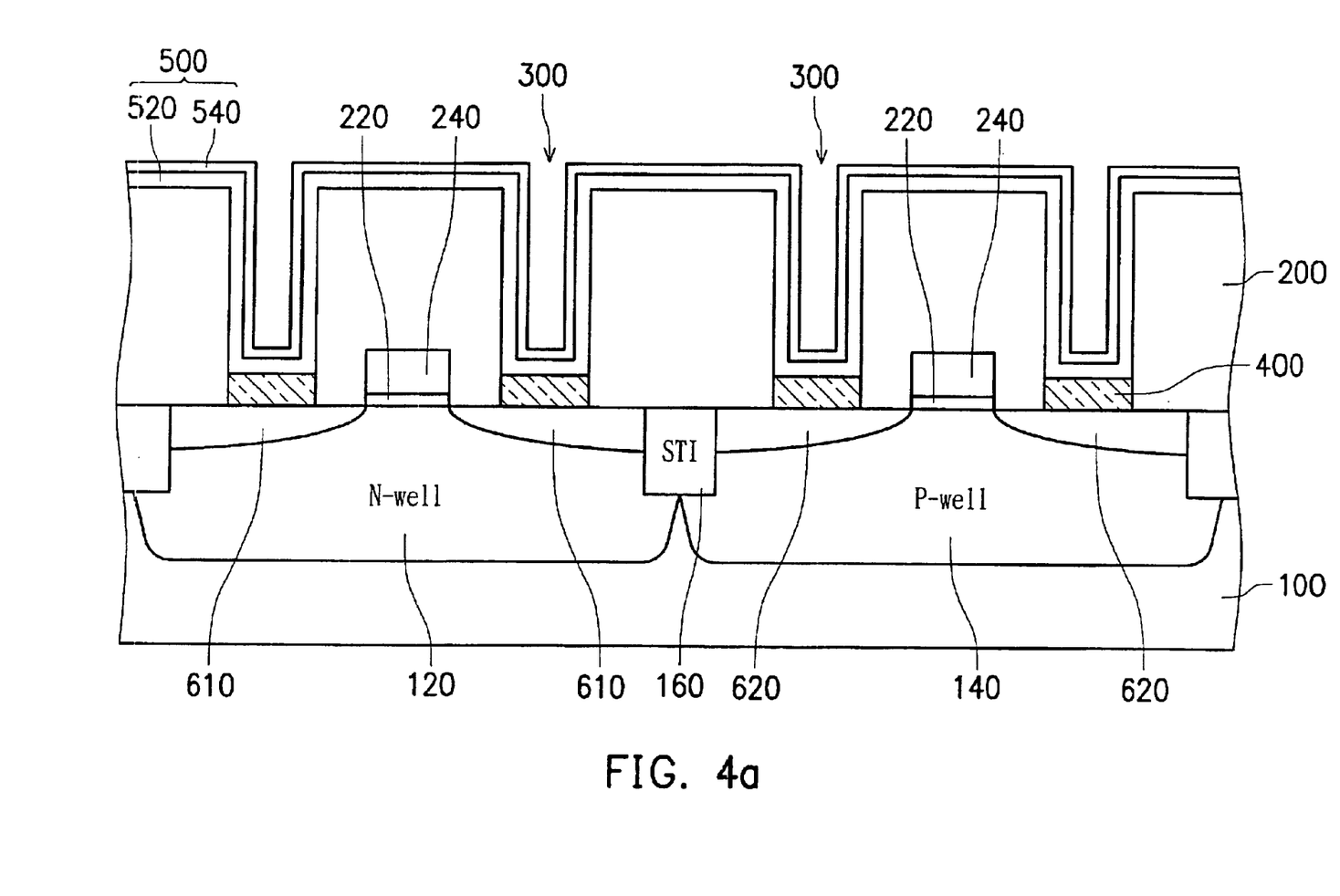
FIGS. 4a to 4e are cross-sections illustrate the process flow of fabricating a CMOS according to a fourth embodiment of the present invention.

The metal contact of the present invention can be readily integrated with a CMOS device. FIGS. 4a to 4e illustrate the process flow of fabricating a CMOS according to a fourth embodiment of the present invention. In FIG. 4a, separate N-well 120 and P-well 140 are formed in a semiconductor substrate 100 by selectively implanting the appropriate dopant in each well area. Next, shallow trench isolation (STI) is formed to isolate the active device areas wherein the field effect transistor (FET) devices are to be built. Next, a thermal oxide is grown to form a gate oxide 220. Next, a polysilicon layer 240 is formed to constitute a gate structure for the N-channel and P-channel FETs. Next, source/drain areas 610 in the N-well 120 and source/drain areas 620 in the P-well 140 are separately formed.

Subsequently, a dielectric layer 200 is formed on the substrate 100. A contact opening 300 to the source/drain areas 610 and 620 is formed in the dielectric layer 200 to expose the semiconductor substrate 100. Next, a $Si_xGe_{1-x}$ layer 400 (0<x<1) is formed in the contact opening 300.

Subsequently, a metal layer 500 is formed on the $Si_xGe_{1-x}$ layer 400. For example, the metal layer can be composed of a glue layer 520 and a diffusion barrier layer 540, which are formed both on the $Si_xGe_{1-x}$ layer 400 and on the sides of the contact opening 300. The glue layer 520 can be a titanium (Ti) layer, which has good adhesion to dielectric layer 200. The diffusion barrier layer 540 can be a TiN layer, serving as a diffusion barrier to protect the semiconductor silicon substrate 100 from fluorine attack during post tungsten deposition processes. Alternatively, the glue/diffusion barrier layer can also be a W/WN layer.

Figure 4B:
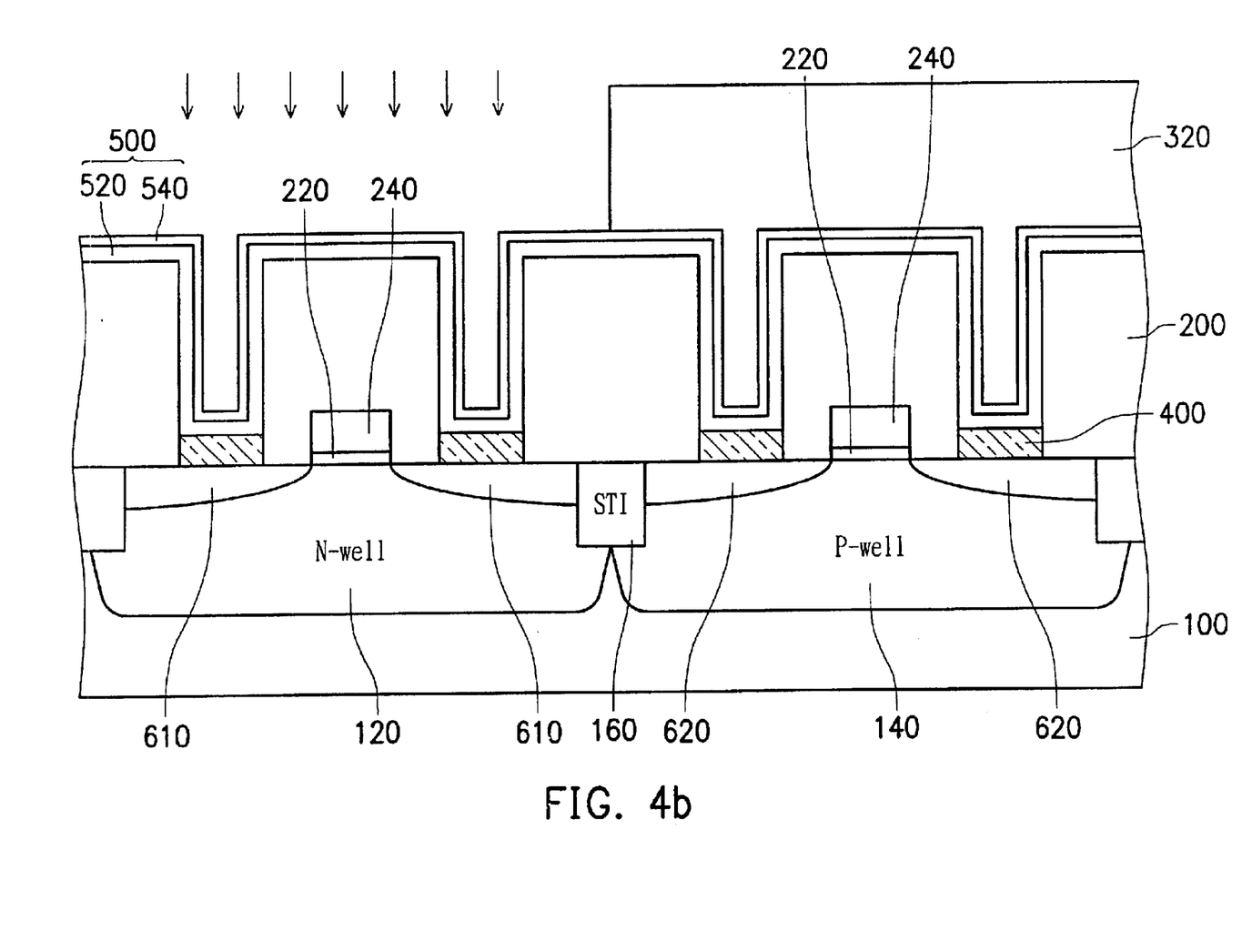

Subsequently, in FIG. 4b, a photoresist layer 320 is formed to mask the P-well area. The substrate is then subjected to implantation, that is, a P-type dopant such as boron or boron fluoride is implanted into the metal layer 500 and the $Si_xGe_{1-x}$ layer 400 in the N-well area.

Figure 4C:
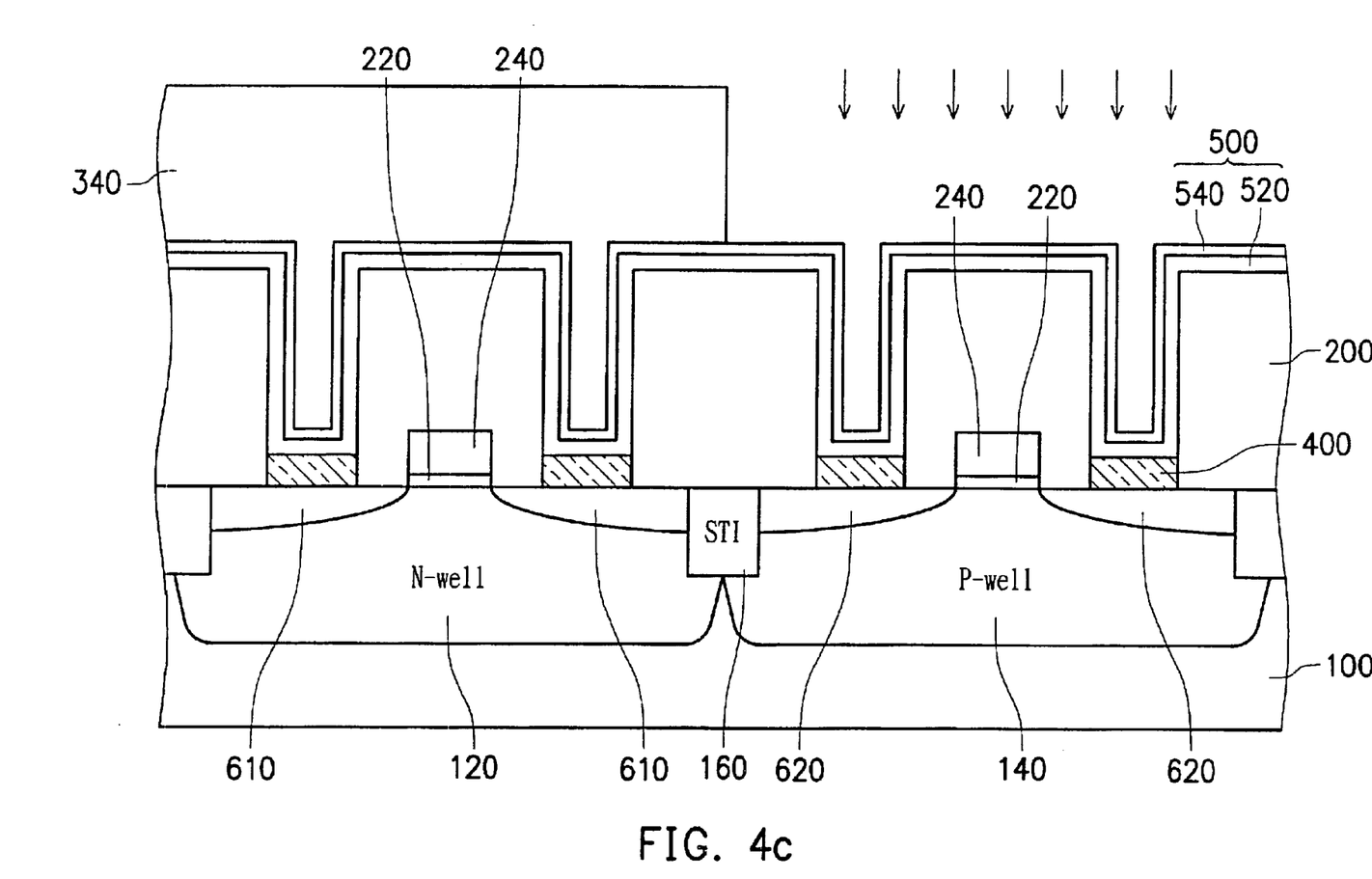

Subsequently, in FIG. 4c, a photoresist layer 340 is formed to mask the N-well area. The substrate is then subjected to implantation, that is, a N-type dopant such as arsenic or phosphorous is implanted into the metal layer 500 and the $Si_xGe_{1-x}$ layer 400 in the P-well area.

Figure 4D:
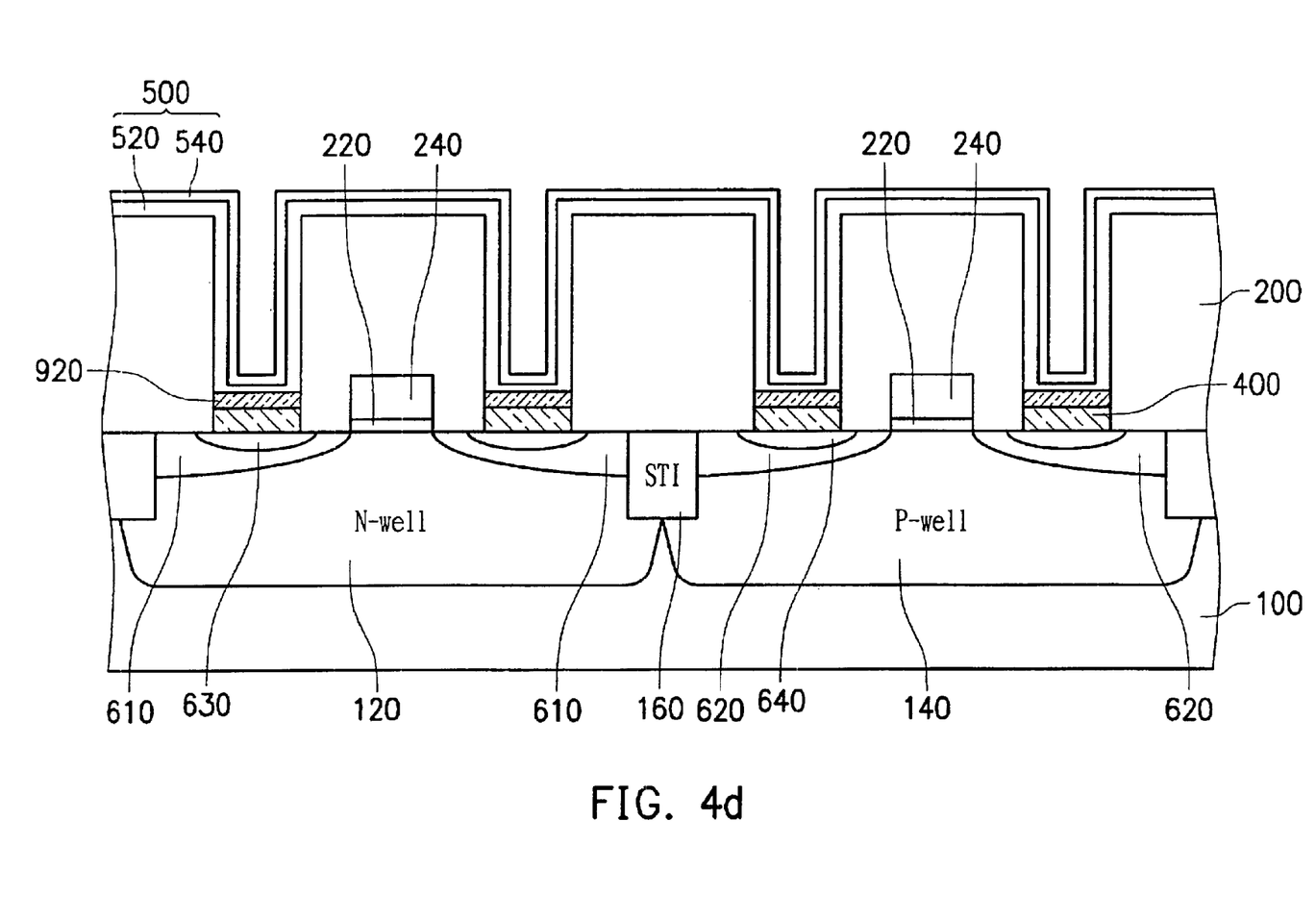

Subsequently, in FIG. 4d, annealing is conducted to transform the metal layer 500 into a metal silicide layer 920 and to diffuse the dopant into the semiconductor substrate 100 in a SADS (salicide as a doping source) manner to form a diffusion region 630 in the source/drain area 610 in the N-well 120 and diffusion region 640 in the source/drain area 620 in the P-well 140.

Figure 4E:
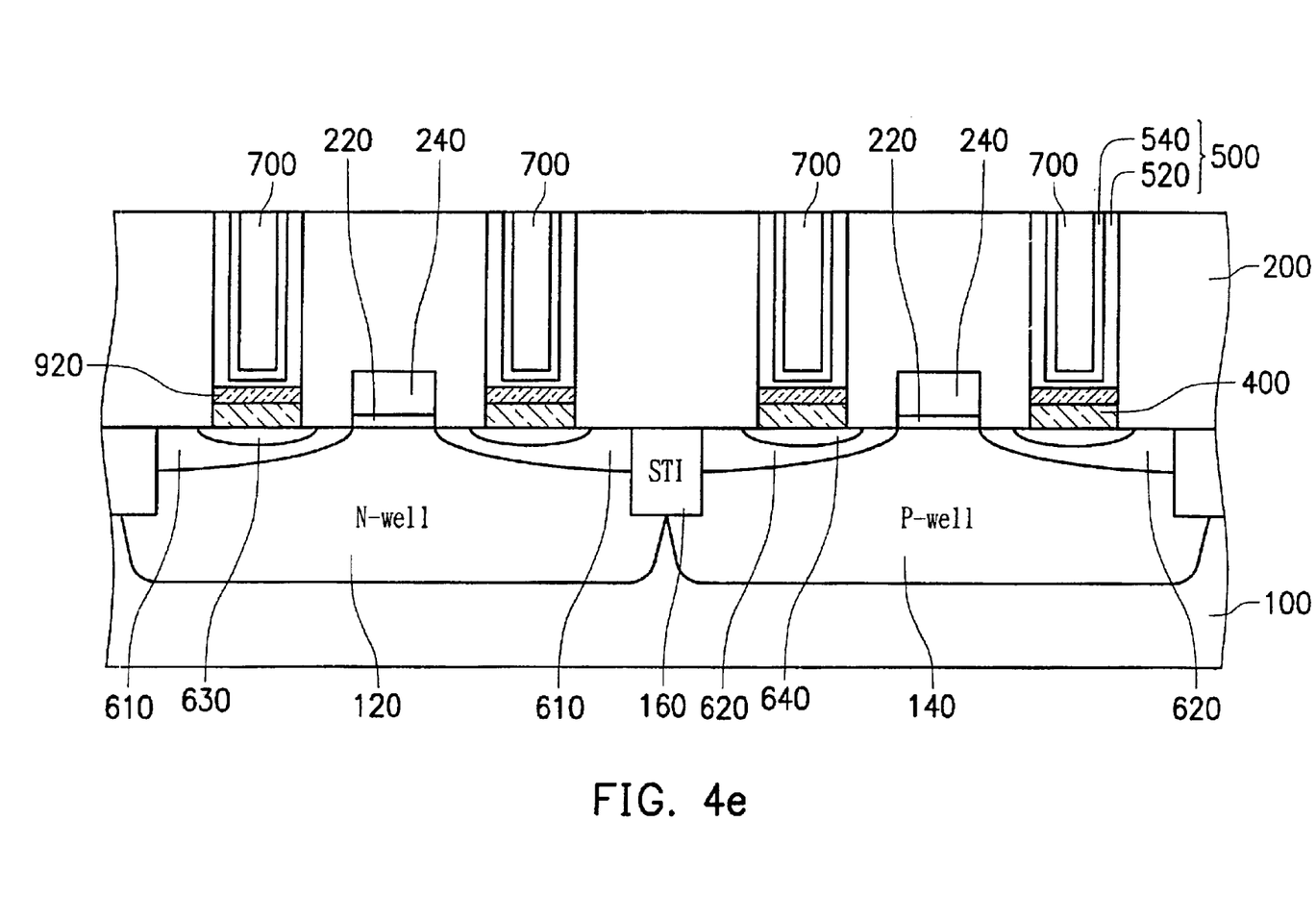

Finally, in FIG. 4e, a metal plug 700 is filled on the metal layer 500 into the contact opening 300. For example, a tungsten layer is formed by selective tungsten deposition. Then, chemical mechanical polishing (CMP) is performed to planarize the tungsten layer and remove the metal layer 500 on the dielectric layer 200.

Figure 5:
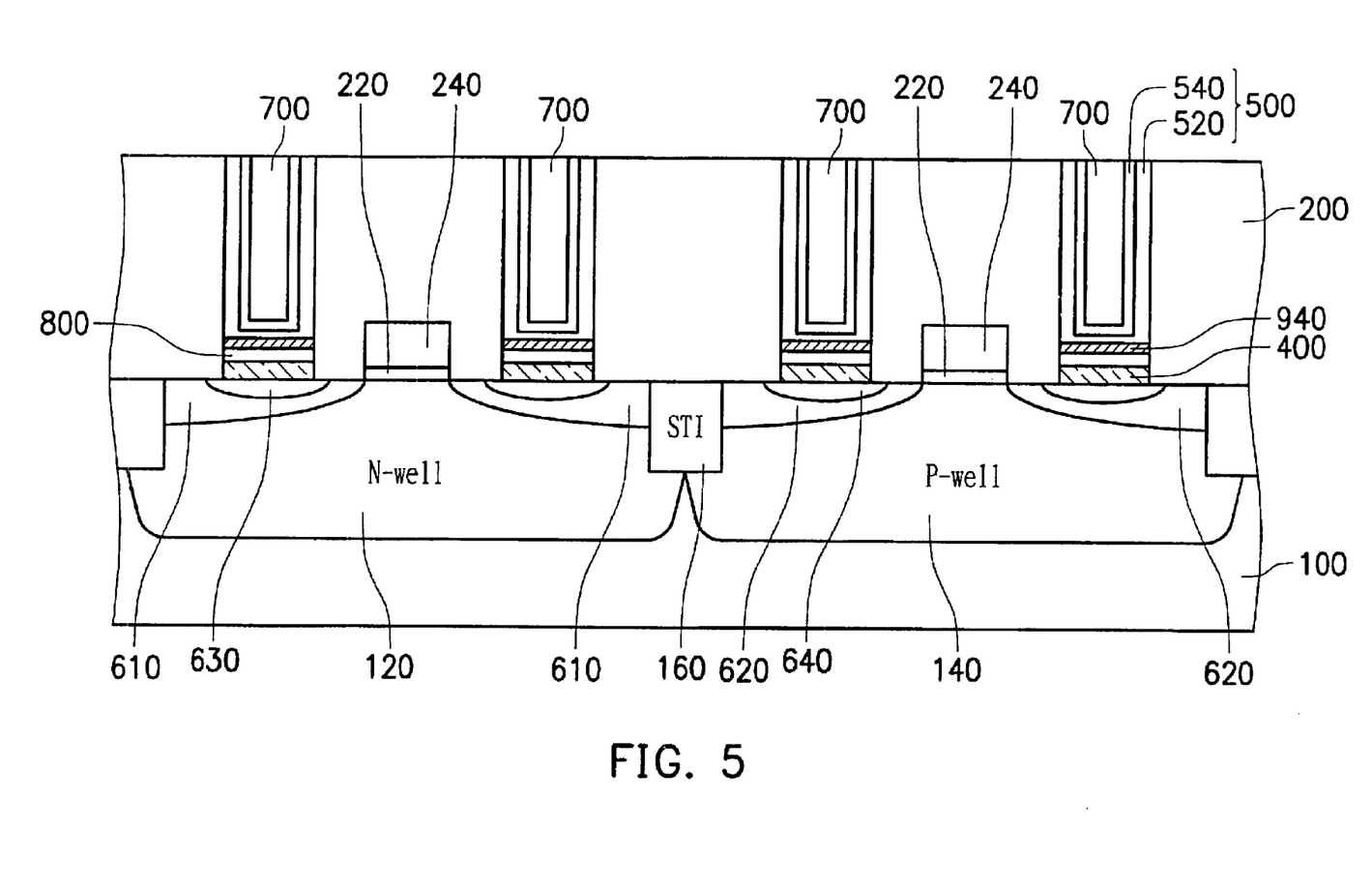
FIG. 5 is a cross-section of a CMOS according to a fifth embodiment of the present invention.

FIG. 5 shows a cross-section of a CMOS according to a fifth embodiment of the present invention. This CMOS structure is the same as that of the fourth embodiment, except that this embodiment additionally selectively forms a consumable polysilicon layer 800 between the Si—Ge layer 400 and the metal layer 500. The numerals are the same as in FIGS. 4a to 4e in order to represent the same elements. The procedures for fabricating the CMOS of FIG. 5 are similar to those for fabricating the CMOS of FIG. 4e and are omitted to avoid redundance. Please refer also to FIGS. 2a to 2d. As described above, a portion of the consumable polysilicon layer 800 is consumed to form the metal silicide layer 940. Thus, in the silicidation step, the polysilicon layer 800 instead of the $Si_xGe_{1-x}$ layer 400 is consumed. This can maintain the integrity of the $Si_xGe_{1-x}$ layer 400 without it becoming thinner, thereby the low SBH can be maintained.

Figure 6:
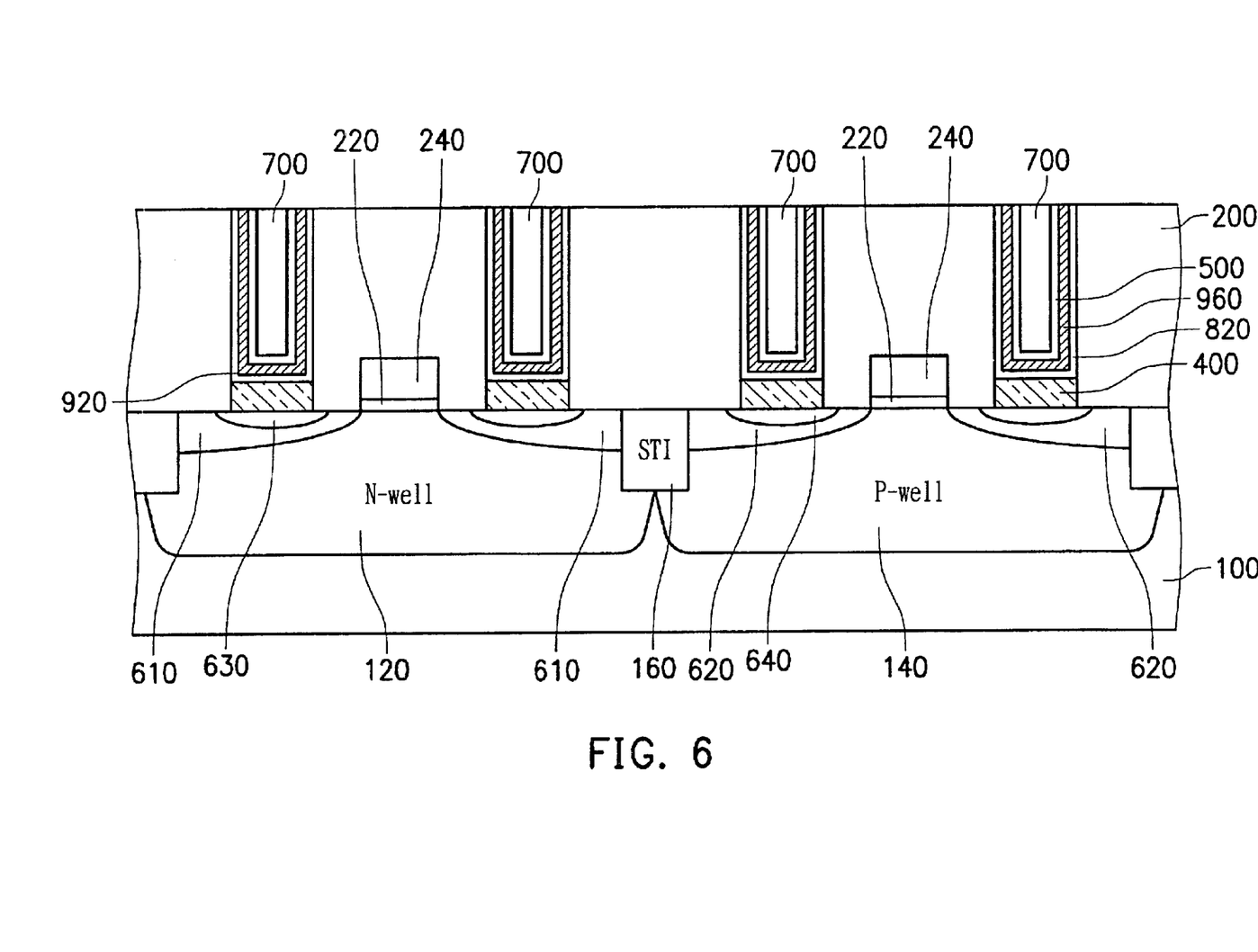
FIG. 6 is a cross-section of a CMOS according to a sixth embodiment of the present invention.

Now refer to FIG. 6, showing a cross-section of a CMOS according to a sixth embodiment of the present invention. This CMOS structure is the same as that of the fourth embodiment, except that this embodiment additionally forms a conformal consumable polysilicon layer 820 between the Si—Ge layer 400 and the metal layer 500. The numerals are the same as in FIGS. 4a to 4e in order to represent the same elements. The procedures for fabricating the CMOS of FIG. 5 are similar to those for fabricating the CMOS of FIG. 4e and are omitted to avoid redundance. Please also FIGS. 3a to 3e. As described above, a portion of the consumable polysilicon layer 820 is consumed to form the metal silicide layer 960. Thus, in the silicidation step, the polysilicon layer 820 instead of the $Si_xGe_{1-x}$ layer 400 is consumed. This can maintain the integrity of the $Si_xGe_{1-x}$ layer 400 without becoming thinner, thereby the low SBH can be maintained. Moreover, in this embodiment, the consumable polysilicon layer 820 is conformally formed, that is, it is formed both on the $Si_xGe_{1-x}$ layer 400 and on the sides of the contact opening 300. Since a polysilicon layer serves as an excellent glue layer to the dielectric layer 200, titanium or other glue layers to ILD may be omitted. This can cut down the production cost.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A semiconductor device comprising:
   a semiconductor a substrate;
   a dielectric layer on the semiconductor substrate, having a contact opening exposing the semiconductor substrate;
   a $Si_xGe_{1-x}$ layer formed within the contact opening, wherein 0<x<1;
   a metal silicide layer on the $Si_xGe_{1-x}$ layer; and
   a metal plug over the metal silicide layer filling the contact opening;
   wherein the $Si_xGe_{1-x}$ layer is a strained $Si_xGe_{1-x}$ layer not causing dislocation in the semiconductor substrate.

2. The semiconductor device as claimed in claim 1, wherein the $Si_xGe_{1-x}$ layer is a silicon-rich $Si_xGe_{1-x}$ layer and 0.5<x<0.95.

3. The semiconductor device as claimed in claim 1, wherein the $Si_xGe_{1-x}$ layer has a thickness more than or equal to 5 nm and less than or equal to 30 nm.

4. A semiconductor device comprising:
  a semiconductor substrate;
  a dielectric layer on the semiconductor substrate, having a contact opening exposing the semiconductor substrate;
  a $Si_xGe_{1-x}$ layer formed within the contact opening, wherein 0<x<1;
  a metal silicide layer on the $Si_xGe_{1-x}$ layer;
  a metal plug over the metal silicide layer filling the contact opening; and
  a glue layer and a diffusion barrier layer between the metal silicide layer and the metal plug, wherein the glue layer and diffusion barrier layer are formed both on the metal silicide layer and on the sides of the contact opening.

5. The semiconductor device as claimed in claim 1, wherein the $Si_xGe_{1-x}$ layer has a thickness more than 30 nm.

6. A semiconductor device comprising:
  a semiconductor substrate;
  a dielectric layer on the semiconductor substrate, having a contact opening exposing the semiconductor substrate;
  a $Si_xGe_{1-x}$ layer formed within the contact opening, wherein 0<x<1;
  a metal suicide layer on the $Si_xGe_{1-x}$ layer; and
  a metal plug over the metal suicide layer filling the contact opening; and
  a diffusion region in the semiconductor substrate under the $Si_xGe_{1-x}$ layer.

7. A semiconductor device comprising:
  a semiconductor substrate;
  a dielectric layer on the semiconductor substrate, having a contact opening exposing the semiconductor substrate;
  a $Si_xGe_{1-x}$ layer formed within the contact opening, wherein 0<x<1;
  a consumable polysilicon layer on the $Si_xGe_{1-x}$ layer; and
  a metal plug over the consumable polysilicon layer filling the contact opening.

8. The semiconductor device as claimed in claim 7, further comprising a metal suicide layer between the polysilicon layer and the metal plug.

9. The semiconductor device as claimed in claim 8, further comprising a glue layer and a diffusion barrier layer between the consumable polysilicon layer and the metal plug, wherein the glue layer and diffusion barrier layer are formed both on the consumable polysilicon layer and on the sides of the contact opening.

10. The semiconductor device as claimed in claim 7, wherein the consumable polysilicon layer is formed both on the $Si_xGe_{1-x}$ layer and on the sides of the contact opening.

11. The semiconductor device as claimed in claim 10, further comprising a metal silicide layer between the polysilicon layer and the metal plug.

12. The semiconductor device as claimed in claim 11, further comprising a diffusion barrier layer between the consumable polysilicon layer and the metal plug, wherein the diffusion barrier layer formed both on the consumable polysilicon layer and on the sides of the contact opening.

13. The semiconductor device as claimed in claim 7, wherein the consumable polysilicon layer has a thickness of 10 nm to 50 nm.

14. The semiconductor device as claimed in claim 1, wherein the semiconductor device is a CMOS device.

* * * * *